United States Patent
Arai

(10) Patent No.: US 7,868,697 B2
(45) Date of Patent: Jan. 11, 2011

(54) CONVERTING CIRCUIT FOR CONVERTING DIFFERENTIAL SIGNAL TO SINGLE-ENDED SIGNAL

(75) Inventor: Tomoyuki Arai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 12/324,102

(22) Filed: Nov. 26, 2008

(65) Prior Publication Data

US 2009/0243730 A1    Oct. 1, 2009

(30) Foreign Application Priority Data

Mar. 28, 2008   (JP) ............................. 2008-088458

(51) Int. Cl.
*H03F 3/45* (2006.01)
*H03F 1/22* (2006.01)

(52) U.S. Cl. ...................................... 330/301; 330/311
(58) Field of Classification Search ................. 330/301, 330/311
See application file for complete search history.

(56) References Cited

U.S. PATENT DOCUMENTS

| 5,202,645 A * | 4/1993 | Phan et al. ................. 330/253 |
| 7,538,618 B2 * | 5/2009 | Park et al. ................... 330/301 |
| 2003/0013419 A1 | 1/2003 | Razavi et al. | |

FOREIGN PATENT DOCUMENTS

JP    8-288762    11/1996

OTHER PUBLICATIONS

European Search Report dated Jul. 10, 2009, from the corresponding European Application.
Behzad Razavi, et al. "A 0.13 / spl mu/m CMOS UWB transceiver" Solid-State Circuits Conference, Digest of Technical Papers, Jan. 1, 2005, pp. 216-217 & 594, vol. 1.
C. C. Meng, et al., "A High Isolation CMFB Downconversion Micromixer Using 0.18-pm Deep N-Well CMOS", 2003, pp. 619-622, IEEE Radio Frequency Integrated Circuits Symposium.

* cited by examiner

*Primary Examiner*—Steven J Mottola
(74) *Attorney, Agent, or Firm*—Fujitsu Patent Center

(57) ABSTRACT

A converting circuit for converting differential signals to a single-ended signal. The converting circuit comprises a cascode amplifier comprising a first transistor and a second transistor, wherein the first transistor comprises a control terminal, a first terminal, and a second terminal, the control terminal to which one of the differential signals is input, the control terminal being electrically-grounded; and, the second transistor comprises a first terminal and a second terminal, the first terminal of the second transistor being connected to the first terminal, the second terminal of the second transistor from which output signal is outputted, a capacitor for adjusting the phase, the capacitor being connected to the second terminal; and a current source being connected to the second terminal.

6 Claims, 5 Drawing Sheets

CONVERTING CIRCUIT FOR CONVERTING DIFFERENTIAL SIGNAL TO SINGLE-ENDED SIGNAL

CROSS-REFERENCE TO RELATED APPLICATIONS

This application is based upon and claims the benefit of priority of the prior Japanese Patent Application No. 2008-088458, filed on Mar. 28, 2008, the entire contents of which are incorporated herein by reference.

FIELD

The embodiment discussed herein is directed to a converting circuit for converting differential signal to single-ended signal.

BACKGROUND

As illustrated in FIG. 5A, a converting circuit 51 having balun is known as an existing converting circuit for converting differential signals to a single-ended signal. In converting circuit 51, a set of differential signals is outputted from input terminal IN and inversion input terminal INX. The input differential signal can be outputted via inductive coupling by coils 52 and 53 as single-ended signal from output terminal OUT.

Further, as illustrated in FIG. 5B, a converting circuit 61 comprising an active element, i.e., transistor, is known as an existing converting circuit for converting differential signals to a single-ended signal. In converting circuit 61, output signal from drain of transistor 63 of one differential amplifier circuit can be outputted as single-ended signal.

Converting circuit 51 having balun does not expend power consumption, and removes common-mode signal noise. However, since balun requires coils 52 and 53, chip area for converting circuit 51 is wide. If converting circuit 51 is a discrete circuit, many components are required to compose converting circuit 51. On the other hand, as illustrated in FIG. 5B, converting circuit 61 having a transistor does not use elements in converting circuit 62. Therefore, half of the power consumption of converting circuit 61 is lost. Further, since only the output signal from drain of transistor 63 is outputted, common-mode signal noise cannot be removed in converting circuit 61.

SUMMARY

According to an aspect of the invention, a converting circuit for converting differential signals to a single-ended signal, the differential signals being input to the converting circuit and the single-ended signal being outputted to the converting circuit, comprising: a cascode amplifier comprising a first transistor and a second transistor, wherein: the first transistor comprises a control terminal, a first terminal, and a second terminal, the control terminal to which one of the differential signals is input, the control terminal being electrically-grounded; and, the second transistor comprises a first terminal and a second terminal, the first terminal of the second transistor being connected to the first terminal, the second terminal of the second transistor from which the output signal is outputted, a capacitor for adjusting the phase, the capacitor being connected to the second terminal; and, a current source being connected to the second terminal.

The capacitor can be a variable capacitor. The current source can be a third transistor comprising a control terminal that is connected with grounded capacitor. Bias point of one differential signal can be equal to bias point of the other differential signal. The variable capacitor can be controlled based on oscillation signal frequency outputted from synthesizer included in wireless equipment, if the converting circuit is applied to the wireless equipment.

Additional objects and advantageous of the embodiment will be set forth in part in the description which follows, and in part will be obvious from the description, or may be learned by practice of the invention. The object and advantageousness of the invention will be realized and attained by means of the elements and combinations particularly pointed our in the appended claims.

It is to be understood that both the foregoing general description and the following detailed description are exemplary and explanatory only and are not restrictive of the invention, as claimed.

BRIEF DESCRIPTION OF DRAWINGS

In the following the embodiment will be described with reference to the accompanied drawings, in which.

DESCRIPTION OF EMBODIMENT(S)

Figure 1:
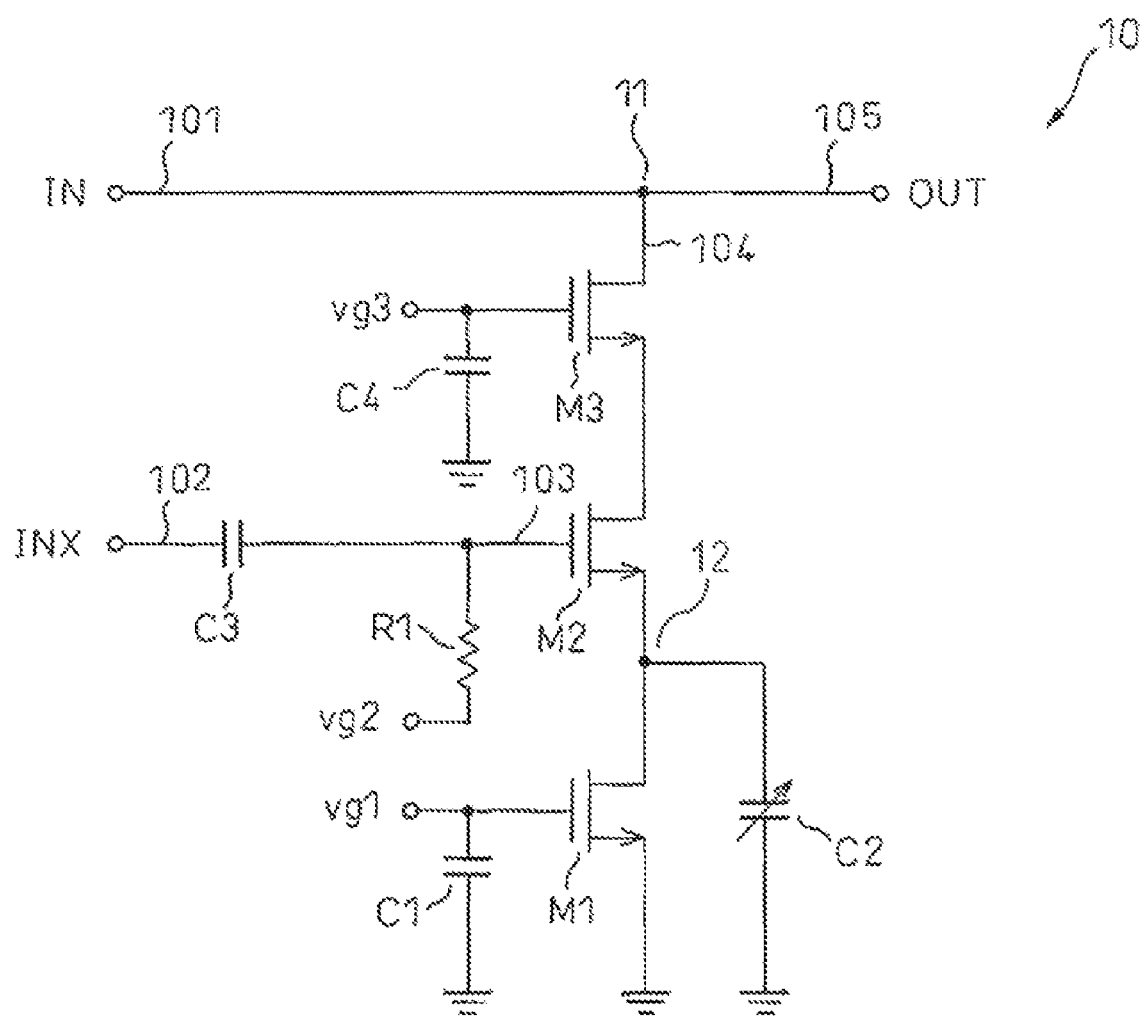
FIG. 1 illustrates one embodiment of a converting circuit for converting a differential signal to a single-ended signal.

FIG. 1 illustrates one embodiment of a converting circuit for converting a differential signal to a single-ended signal. As illustrated, a converting circuit 10 for converting a differential signal to a single-ended signal is an amplifier having a cascode circuit that includes NMOSFET M2 and M3. NMOSFET is metal oxide semiconductor field effect transistor that is composed of a channel of n-type semiconductor material. The input signal from input terminal IN and inversion input signal from inversion input terminal INX input to the drain of transistor M3 and the gate of transistor M2, respectively. Those signals output from output terminal OUT.

Transistor M3 functions as grounded gate circuit. Bias voltage vg3 is applied to the gate of transistor M3, and is maintained at a constant voltage by grounded capacitor C4.

Transistor M2 functions as grounded source circuit. The gate of transistor M2 is connected via capacitor C3 to input terminal INX. The source of transistor M2 is connected to the drain of transistor M1. Bias voltage vg2 is applied to the gate of transistor M2. The drain of transistor M2 is connected to the source of transistor M3.

Capacitor C3 is a coupling capacitor, and prevents a direct current component from entering into transistor M2. However, if bias voltage used in a preprocessed circuit is applied to input terminal INX, capacitor C3 and resistor R1 can be omitted.

The source of transistor M2 is connected to variable capacitor C2. If the capacitance of variable capacitor C2 is changed, the frequency characteristic of converting circuit 10 is changed, common-mode signal noise included in the input signal, which is subject to removal, can be changed. Further, the capacitance of variable capacitor C2 may be controlled according to the output frequency of the frequency synthesizer, which cannot be illustrated in FIG. 2. For example, if converting circuit 10 is applied to a wireless device such as a mobile station or a wireless station, the capacitance of the variable capacitor C2 can be controlled according to the oscillation frequency that is outputted from a frequency synthesizer included in the wireless device and that is used to receive a radio frequency, whereby local noise can be effectively removed.

Bias voltage vg1 is applied to the gate of transistor M1, and is maintained at a constant voltage by grounded capacitor C1. Transistor M1 functions as a current source.

Figure 2:
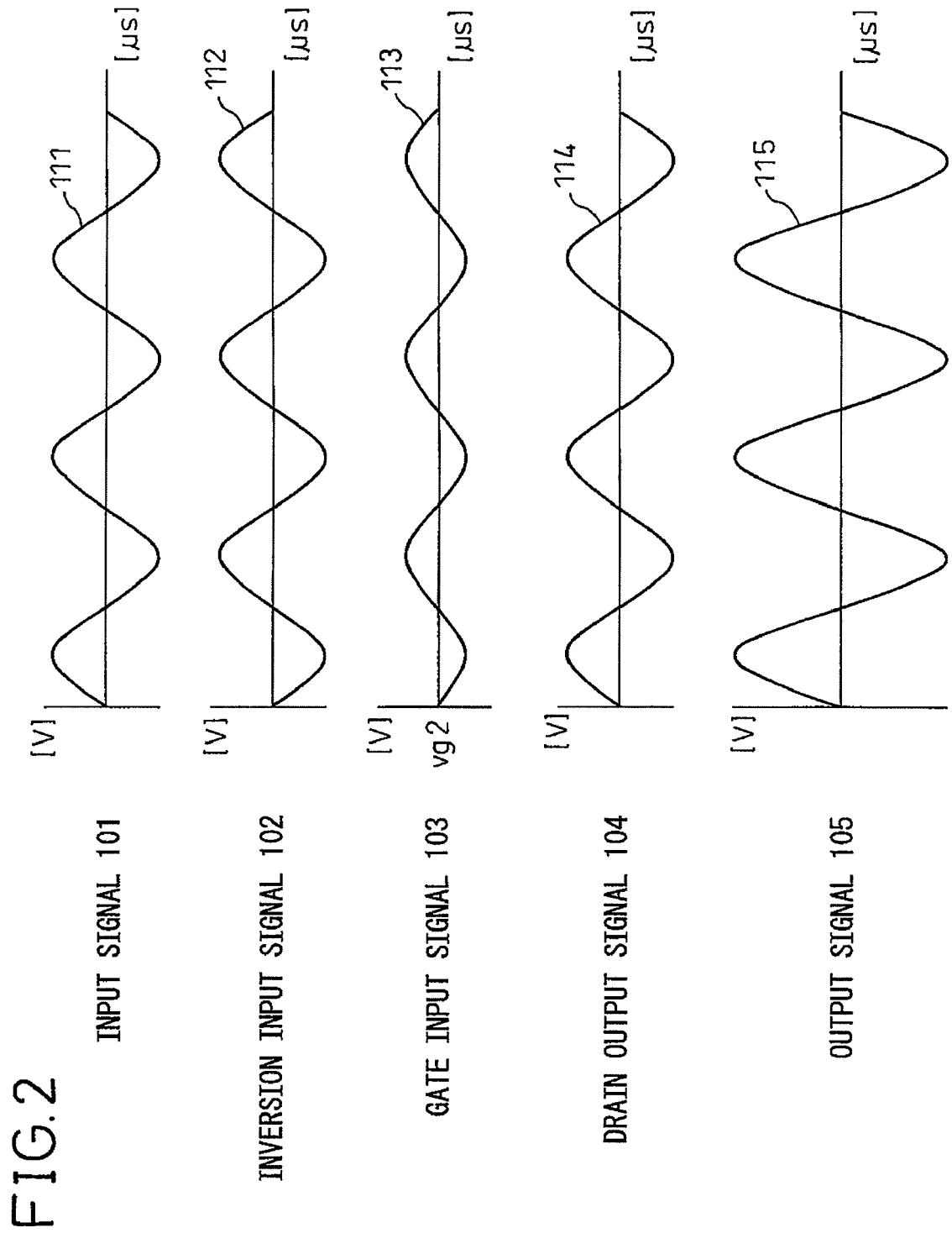
FIG. 2 illustrates an example of waveform of an input or output signal.

FIG. 2 illustrates waveforms of input or output signals detected on the 101 to 105 points illustrated in FIG. 1. Waveform 111 is a waveform of input signal 101 from input terminal IN. Waveform 112 is a waveform of inversion input signal 102. As indicated in waveform 111, 112, the phase difference between input signal 101 and inversion input signal 102 is a 180 degree. Waveform 113 is a waveform of gate input signal 103. As indicated in waveform 113, gate input signal 103 is a signal on bias voltage vg2. Waveform 114 is a waveform of drain output signal 104. As indicated in waveform 114, drain output signal 104 from transistor M3 is created by inverting inversion input signal 102, and the phase and voltage of drain output signal 104 are the same as those of input signal 101. By controlling the gain of transistor M2, the signal level of drain output signal 104 can be adjusted. Waveform 115 is a waveform of output signal 105. As indicated in waveform 115, output signal 105 is a signal synthesized from input signal 101 and drain output signal 104 from transistor M3.

Thus, transistor M2, M3 function as cascode circuit, the inversion input signal 102 from the gate of transistor M2 is inverted and outputted from the drain of transistor M3. Further, the inverted inversion input signal is synthesized with input signal 101.

Further, output impedance of cascode circuit is higher than that of grounded source circuit. Therefore, output impedance of cascode circuit measured from node 11 is higher than that of node 12, and input signal 101 is outputted to output terminal OUT. Consequently, input signal 101 from input terminal IN cannot be degraded by the change of frequency characteristic of transistor M2 and M3 or interference of reflective wave.

Further, cascode circuit has a frequency characteristic of grounded gate circuit. Therefore, cascode circuit allows broader spectrum signal to input cascode circuit, compared to single grounded source circuit.

Figure 5B:
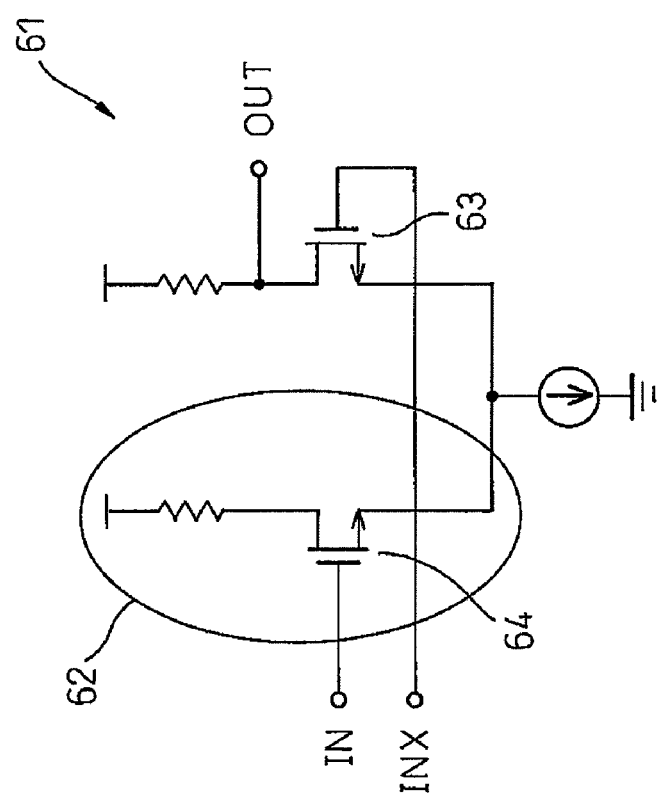
Figure 5A:
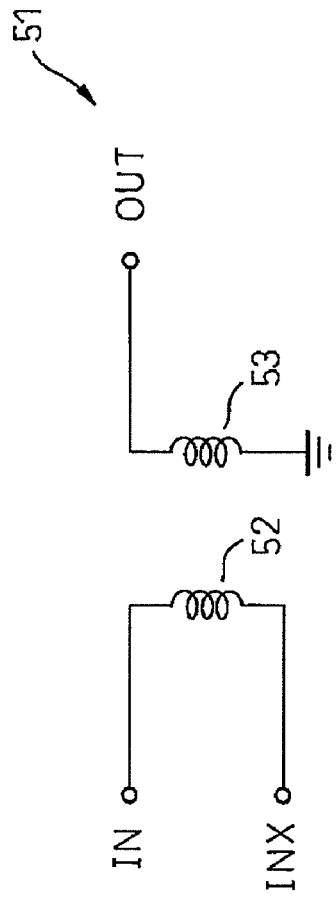

In converting circuit 10, it is possible to control phase of common-mode signal that is subjected to removal. Simulation result indicates that more than 30 dB of common-mode signal noise in converting circuit 10 is removed, compared with removal of noise in known converting circuit illustrated in FIG. 5B. Further, power consumption of converting circuit 10 can be less than half that of known converting circuit illustrated in FIG. 5B, in which one of differential signals is used.

As explained above, converting circuit 10 inverts inversion input signal 102, and combines inverted inversion input signal and input signal 101. Therefore, converting circuit 10 can remove common-mode signal noise, reduce power consumption and minimize chip area. Further, in converting circuit 10, frequency of common-mode signal noise can be controlled, thereby converting circuit 10 can be preferably applied to broad band input signal.

Figure 3:
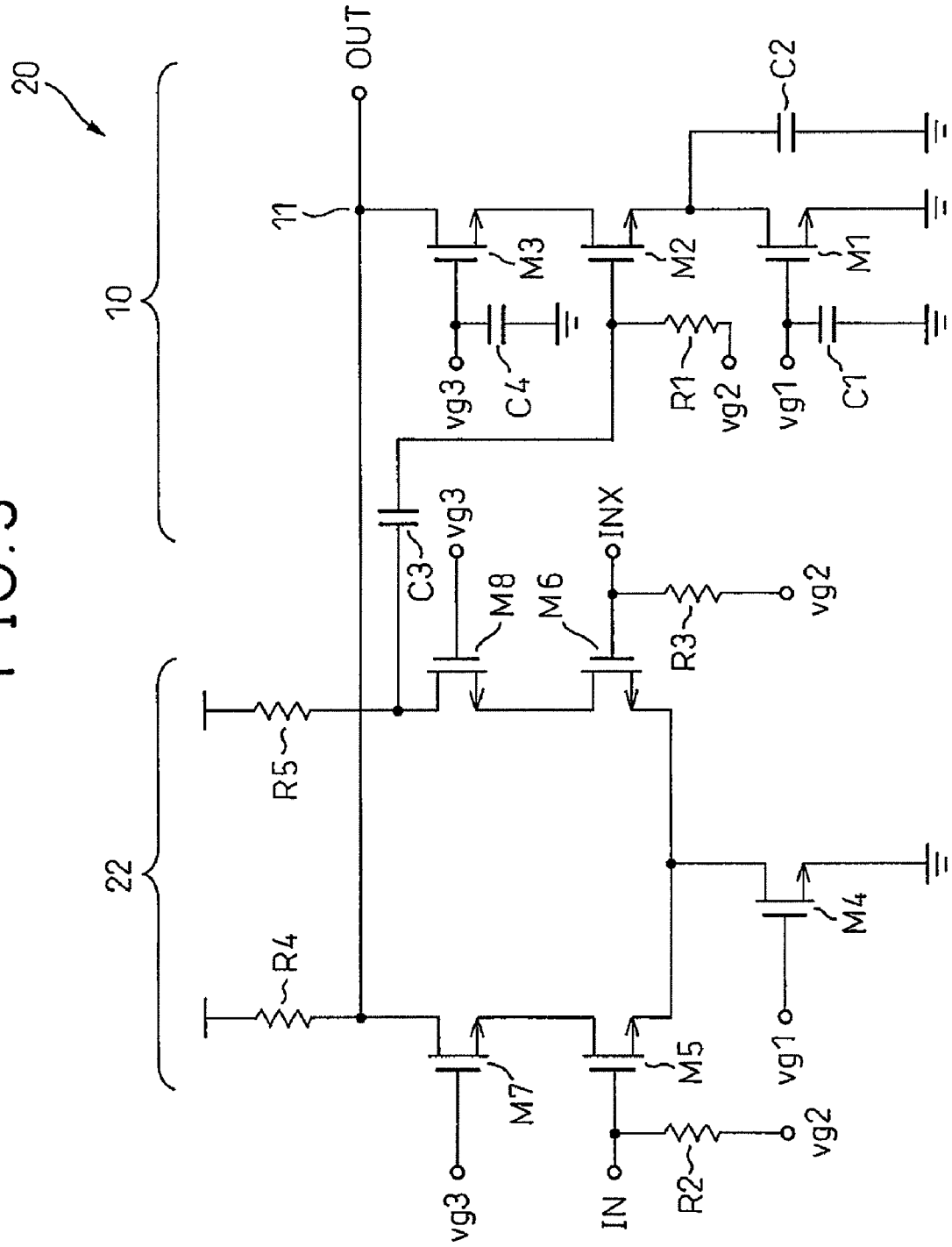
FIGS. 3 and 4 illustrate a converting circuit for converting a differential signal to a single-ended signal; and, FIGS. 5A and 5B illustrate other embodiment of converting circuits for converting a differential signal to a single-ended signal.

FIG. 3 illustrates converting circuit 20 according to another embodiment of a converting circuit for converting differential signals to a single-ended signal. Converting circuit 20 includes transistor M4 to M8, resistors R4 and R5, and differential amplifier circuit 22 that includes resistors R2 and R3 for bias, in addition to components included in converting circuit 10.

The gate of transistor M5 is connected to input terminal IN. The source of transistor M5 is connected to the drain of transistor M4. The gate voltage of transistor M5 is maintained at bias voltage vg2. In the same way, a gate of transistor M6 is connected to input terminal INX. The source of transistor M6 is connected to drain of transistor M4. The gate voltage of transistor M6 is maintained at bias voltage vg2.

Transistor M4 functions as a grounded source circuit. Bias voltage vg1 is applied to the gate of transistor M4 in order to operate transistor M4 below the threshold voltage of transistor M4. Transistor M4 operates as a current source in order to send a constant current to the source side.

Transistors M7, M8, and resistors R4, R5 are configured to get desired gain of differential amplifier circuit 22. Bias voltage vg3 is applied to the gate of transistors M7, M8.

The drain of transistor M7 is connected to output terminal OUT of converting circuit 10. A drain of transistor M6 is connected to input terminal INX of converting circuit 10. Thus, in converting circuit 20, the differential signal is amplified by amplifier circuit 22, and the amplified signal is converted to a single-ended signal by converting circuit 10. Thereby, converting circuit 20 provides two functionalities of amplifying the differential signal and converting the differential signal to a single-ended signal. Further, since bias voltages vg1, vg2 and vg3 are applied to transistors M1, M4, transistors M2, M5, M6, and transistors M3, M7, M8, respectively, the number of bias voltage that should be maintained at constant voltage is minimized, and the above transistors are allowed to perform a common operation in response to fluctuation of bias voltage.

Figure 4:
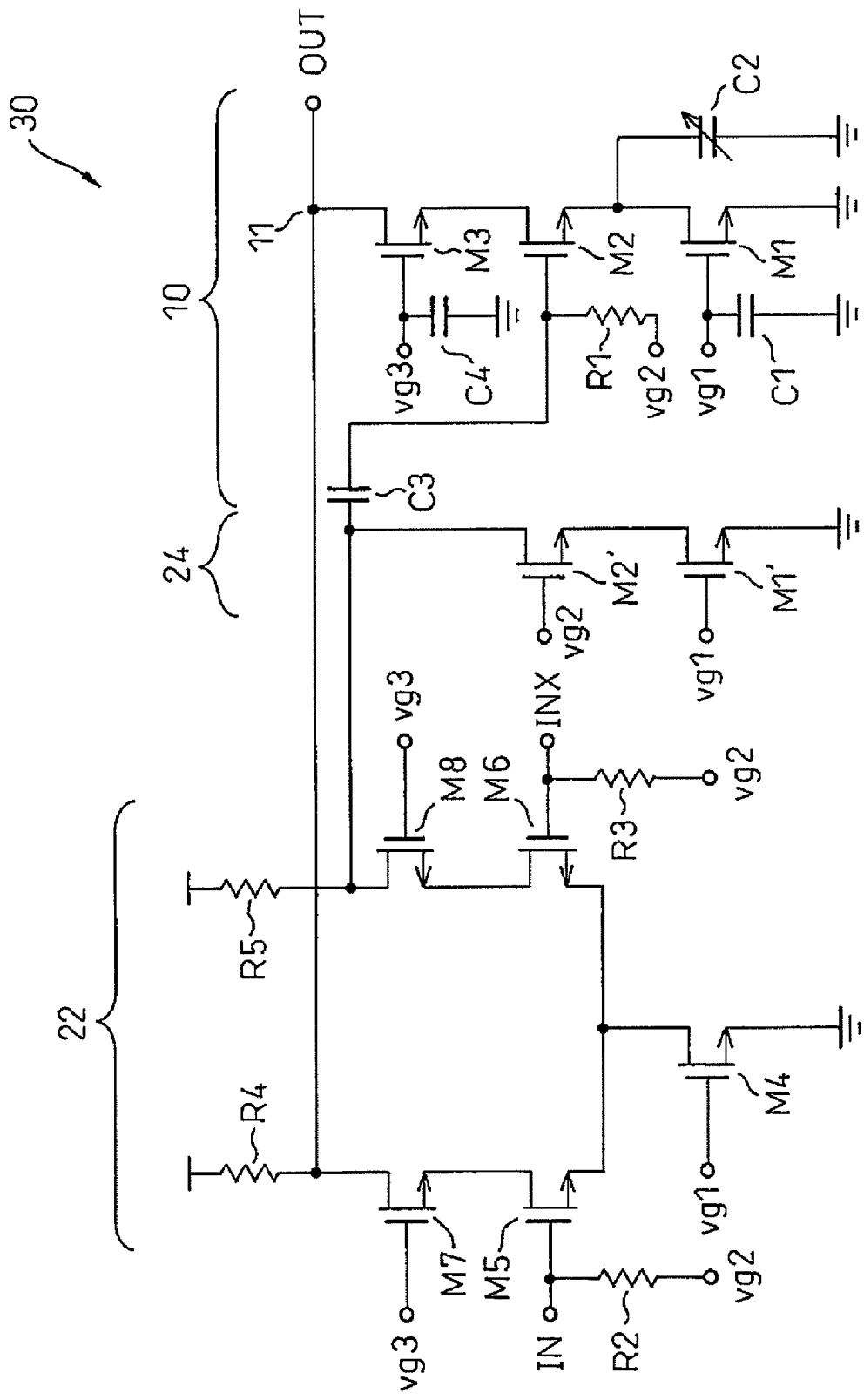

FIG. 4 illustrates converting circuit 30 according to another embodiment of a converting circuit for converting differential signals to a single-ended signal. Converting circuit 30 comprises transistors M1', M2', which are indicated by 24, in addition to components included in converting circuits 10, 20.

In converting circuit 20, capacitor C3 is connected to the drain of transistor M7, and there is no channel for the drain current of transistors M8 to flow out. Therefore, the drain voltage of transistor M7, M8 is not constant. On the other hand, in converting circuit 30, grounded transistors M1', M2' are connected to the drain of transistor M7. Thereby, transistors M7 and M8 provide a balanced characteristic to the output signal thereof. Further, bias voltages vg1 and vg2 are applied to transistor M1' and M2', respectively. Since bias voltages vg1 and vg2 are also applied to other transistors such as transistors M1 and M2, the number of bias voltage vg1, vg2 and vg3 that should be maintained at constant voltage is minimized, and the above transistors are allowed to perform a common operation in response to fluctuation of bias voltage.

The technique described herein can be applied to, for example, an analogue circuit. Further, the transistors are illustrated as NMOFFET in descriptions and figures. However, the technique described in these descriptions can be applied to other types of transistors.

All examples and condition language recited herein are intended for pedagogical purpose to aid the reader in understanding the principles of the invention and the concepts contributed by the inventor to furthering the art, and are to be construed as being without limitation to such specifically recited examples and condition, nor does the organization of such examples in the specification relate to a showing of the superiority and inferiority of the invention. Although the embodiment(s) of the present invention(s) has been described in detail, it should be understood that the various changes, substitutions, and alterations could be made hereto without departing from the spirit and scope of the invention.

What is claimed is:

1. A converting circuit for converting differential signals to a single-ended signal, the differential signals being input to the converting circuit and the single-ended signal being outputted from the converting circuit, comprising:
   a first transistor that includes a first terminal, a second terminal, and a control terminal for receiving a biasing voltage and a first differential signal;
   a second transistor that includes a first terminal for outputting the single-ended signal and a second terminal connected to the first terminal of the first transistor;
   a first capacitor for adjusting the phase of the first differential signal, the capacitor being connected to the second terminal of the first transistor; and
   a current source connected to the second terminal of the first transistor.

2. The converting circuit of claim 1, wherein the first capacitor is a variable capacitor.

3. The converting circuit of claim 1, wherein the current source is a third transistor comprising a control terminal connected to a second capacitor that is grounded.

4. The converting circuit of claim 1, wherein a bias point of the first differential signal is equal to a bias point of a second differential signal.

5. The converting circuit of claim 2, wherein the variable capacitor is controlled based on an oscillation signal frequency outputted from a synthesizer included in a wireless device, to which the converting circuit is applied.

6. The converting circuit of claim 1, wherein the first transistor and the second transistor form a cascode amplifier.

* * * * *